(12) United States Patent
Lee

(10) Patent No.: US 7,452,174 B2
(45) Date of Patent: Nov. 18, 2008

(54) LOAD-LOCK AND SEMICONDUCTOR DEVICE MANUFACTURING EQUIPMENT COMPRISING THE SAME

(75) Inventor: Jin-Goo Lee, Pyeongtaek-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/440,154

(22) Filed: May 25, 2006

(65) Prior Publication Data
US 2007/0107598 A1 May 17, 2007

(30) Foreign Application Priority Data
Nov. 14, 2005 (KR) ............ 10-2005-0108370

(51) Int. Cl.
*H01L 21/677* (2006.01)
(52) U.S. Cl. .................................... 414/217
(58) Field of Classification Search ............. 414/217, 414/217.1, 939
See application file for complete search history.

(56) References Cited

U.S. PATENT DOCUMENTS

| | | | | |
|---|---|---|---|---|
| 4,532,970 A | * | 8/1985 | Tullis et al. | ............ 414/217.1 |
| 4,816,098 A | * | 3/1989 | Davis et al. | ............ 156/345.31 |
| 5,431,600 A | * | 7/1995 | Murata et al. | ............ 454/187 |
| 5,855,681 A | * | 1/1999 | Mayden et al. | ............ 118/719 |
| 6,028,734 A | * | 2/2000 | Matsui | ............ 360/96.5 |
| 6,183,186 B1 | * | 2/2001 | Howells et al. | ............ 414/416.03 |
| 6,224,679 B1 | * | 5/2001 | Sasaki et al. | ............ 118/719 |
| 6,388,436 B1 | * | 5/2002 | Nodot et al. | ............ 324/158.1 |
| 6,543,981 B1 | * | 4/2003 | Halsey et al. | ............ 414/217.1 |
| 6,653,994 B2 | | 11/2003 | Takeda et al. | |
| 7,048,493 B2 | * | 5/2006 | Kobayashi et al. | ............ 414/810 |
| 7,114,908 B1 | * | 10/2006 | Sarver et al. | ............ 414/790.2 |
| 2001/0014267 A1 | * | 8/2001 | Yamaga et al. | ............ 414/217 |
| 2002/0098067 A1 | * | 7/2002 | De Luna et al. | ............ 414/404 |
| 2002/0146312 A1 | * | 10/2002 | Chokshi et al. | ............ 414/803 |
| 2003/0230239 A1 | * | 12/2003 | Shan | ............ 118/715 |
| 2004/0105738 A1 | * | 6/2004 | Ahn et al. | ............ 414/222.01 |
| 2004/0120797 A1 | * | 6/2004 | Paul et al. | ............ 414/217.1 |
| 2005/0115591 A1 | * | 6/2005 | Burns et al. | ............ 134/34 |
| 2006/0131521 A1 | * | 6/2006 | Garssen et al. | ............ 250/559.33 |
| 2006/0177287 A1 | * | 8/2006 | Wu et al. | ............ 414/217 |

* cited by examiner

*Primary Examiner*—Saul J. Rodriguez
*Assistant Examiner*—Joshua I Rudawitz
(74) *Attorney, Agent, or Firm*—Volentine & Whitt, PLLC

(57) ABSTRACT

A load-lock and semiconductor device manufacturing equipment have a wafer anti-contamination measure capable of maximizing production yield. The load-lock includes a chamber that can be hermetically sealed, a slit valve disposed at the front of the chamber for placing the chamber in communication with another chamber, a door disposed at the back of the chamber so as to allow a wafer cassette to be introduced into the chamber. In addition to having at least one of the load-locks, the semiconductor manufacturing equipment includes a transfer chamber to which the load-lock is connected, at least one process chamber connected to the transfer chamber, and an exhaust system by which each load-lock chamber is evacuated. The wafer anti-contamination measure may be an anti-eddy cover that covers the open back of a wafer cassette when the cassette is supported in the load-lock chamber. Alternatively, the wafer anti-contamination measure may be ductwork of the exhaust system that extends vertically along the door and/or rear wall of the load-lock chamber.

5 Claims, 10 Drawing Sheets

LOAD-LOCK AND SEMICONDUCTOR DEVICE MANUFACTURING EQUIPMENT COMPRISING THE SAME

BACKGROUND OF THE INVENTION

1. Field of the Invention

The present invention relates to semiconductor device manufacturing equipment. More particularly, the present invention relates to a load-lock and to semiconductor device manufacturing equipment having the same.

2. Description of the Related Art

Typically, a semiconductor device is fabricated by repetitively performing a series of processes, such as photolithography, diffusion, etching, deposition, and metallization processes, on a wafer. The manufacturing equipment for fabricating a semiconductor device includes apparatus for performing each of these processes. Therefore, semiconductor device manufacturing equipment typically includes etching, ion implantation, and deposition apparatus having processing chambers into which a wafer is loaded in a particular sequence. In this respect, the wafer must have a specific orientation relative to the apparatus or else the specific process is not performed with the necessary degree of precision.

Also, particles or contaminants in the air in the respective processing apparatus can adversely affect the production yield. Thus, it is important to keep the interior of the equipment very clean. To this end, each processing chamber of conventional semiconductor device manufacturing equipment is hermetically sealed from the outside and the wafer is processed in a vacuum so that potential contaminants, such as particles, are minimized.

Furthermore, conventional semiconductor device manufacturing equipment also includes a load-lock chamber for accommodating a wafer cassette in which wafers are supported, and a transfer chamber including a robot for transferring wafers from the load-lock chamber to one or more of the process chambers. A vacuum pressure, similar to that prevailing in a process chamber, is created in the load-lock chamber so that the interior of the process chamber does not have to be brought from atmospheric pressure to the vacuum pressure each time a wafer is loaded into the process chamber. This is particularly important in terms of efficiency because the load-lock chamber has a smaller volume than each process chamber and as such, it takes less time to evacuate the load-lock chamber than a process chamber.

Conventional semiconductor device manufacturing equipment as described above may be of a cluster type in which one or two load-lock chambers and a plurality of process chambers are disposed around and connected to the transfer chamber. Furthermore, the semiconductor device manufacturing equipment may include an alignment apparatus for aligning wafers. The chamber of the alignment apparatus is also connected to the transfer chamber. Each wafer removed from the load-lock chamber by an arm of the robot is first introduced into the alignment apparatus so as to be oriented by the alignment apparatus before the wafer is transferred to a process chamber. Accordingly, the load-lock chamber, the transfer chamber, the alignment chamber, and the process chambers are selectively opened and closed during the time a wafer is transferred into and from the chambers. To this end, the semiconductor device manufacturing equipment also includes a respective slit valve interposed between the transfer chamber and each of the load-lock, alignment and process chambers.

As described above, in conventional semiconductor device manufacturing equipment the load-lock chamber is a buffer in which a vacuum is created before the wafer is transferred to a process chamber. Thus, the load-lock chamber provides an environment similar to that within the process chamber, and isolates the environment within the process chamber from the outside air which contains potential contaminants. Furthermore, fumes emanating from the surface of each processed wafer can be diluted and eliminated in the load-lock chamber. Specifically, the wafer is transferred by the robot back into a load-lock chamber after it has been processed in one of the process chambers. Then, a purge gas from an external source is supplied into the load-lock chamber to dilute the fumes. The purge gas is typically nitrogen or argon and is supplied into the load-lock chamber through a purge gas supply line at a rate of several to several tens of sccm. The purge gas supply line is connected to the top of the load-lock chamber. The fumes diluted by the purge gas are removed from the load-lock chamber by a vacuum pump connected to an exhaust port provided at the bottom of the load-lock chamber.

Furthermore, a door is disposed at one side of the load-lock chamber for allowing the wafer cassette to be transferred into and removed from the load-lock chamber. On the other hand, a slit valve disposed on the opposite side of the load-lock chamber serves as a passageway through which the robot arm can enter to extract a wafer from the wafer cassette. In this respect, the wafer cassette supports the wafers so as to lie horizontally when the wafer cassette is supported in the load-lock chamber. An elevator moves the wafer cassette vertically within the load-lock chamber so that each of the wafers supported in the cassette can be extracted by the robot arm. Furthermore, the wafer cassette has an open back that faces the door and through which the wafers can be aligned so that all of the flat zones, for example, of the wafers face in the same direction. The front of the cassette is also open and faces the slit valve in order to allow the robot arm to take the wafers out of the wafer cassette.

However, the conventional semiconductor device manufacturing equipment has the following drawbacks.

First, the supplying of purge gas into the load-lock chamber creates turbulence or an eddy between the back of the wafer cassette and the inner wall of the load-lock chamber adjacent thereto. Any contaminants adhering to the inner wall of the load-lock chamber are dislodged by the turbulence or eddy, thereby generating particles in the load-lock chamber. The particles are blown by the purge gas onto the wafers adjacent the flat zones of the wafers that are exposed at the back of the wafer cassette, thereby contaminating the wafers and reducing the production yield.

Secondly, the slit valve is sometimes opened while the degree of vacuum in the transfer chamber is lower than that in the load-lock chamber. In this case, air is introduced into the load-lock chamber through the slit valve, and dislodges contaminants adhering to the door of the load-lock chamber and/or the inner wall in which the door is formed, i.e., removes contaminants adhering to the side of the load-lock chamber opposite the slit valve. The resulting particles contaminate the wafers near the flat zones of the wafers that are exposed at the back of the wafer cassette, thereby reducing the production yield.

SUMMARY OF THE INVENTION

Therefore, an object of the present invention is to provide a load-lock, and semiconductor device manufacturing equipment comprising the same, capable of maximizing production yield by preventing particles from contaminating wafers in the load-lock chamber, especially locally near or at the flat zones of the wafers exposed at the back of the wafer cassette.

It is another object of the present invention to provide a load-lock, and semiconductor device manufacturing equipment comprising the same, capable of maximizing production yield by suppressing the development of strong currents or eddies when, for example, purge gas is introduced into the load-lock chamber or the slit valve is opened.

In accordance with one aspect of the present invention, a load-lock includes a chamber, a slit valve disposed at a front wall of the chamber, a door disposed at the back wall of the chamber to allow a wafer cassette to be inserted into the chamber, a wafer cassette holder disposed in the chamber and configured to support a wafer cassette in the chamber, and wafer anti-contamination means for preventing wafers in a wafer cassette supported by the wafer cassette holder from being contaminated.

In accordance with another aspect of the present invention, semiconductor device manufacturing equipment includes a process chamber in which a semiconductor device manufacturing process is performed, a transfer chamber to which the process chamber is connected, a robot arm disposed in the transfer chamber, a wafer cassette having an open front and an open back, a load-lock connected to the transfer chamber, an exhaust system connected to an exhaust port of the chamber of the load-lock; and wafer anti-contamination means for preventing wafers from being contaminated while in a wafer cassette supported in the chamber of the load-lock.

The wafer anti-contamination means may include an anti-eddy cover for covering the wafers otherwise exposed at the back of the wafer cassette. Furthermore, the wafer anti-contamination means may include ductwork extending from the exhaust port of the load-lock chamber within the chamber, and including at least one duct that extends vertically along the inner surface of the door of the load-lock and/or the inner surface of the rear wall of the load-lock chamber.

In either or both cases, the wafer anti-contamination means not only prevent a strong current or eddy of air or purge gas from developing inside the load-lock chamber, but also protects the wafers from any particles dislodged from inner wall surfaces of the load-lock chamber by currents or eddies produced in the load-lock chamber.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE PREFERRED EMBODIMENTS

Figure 1:
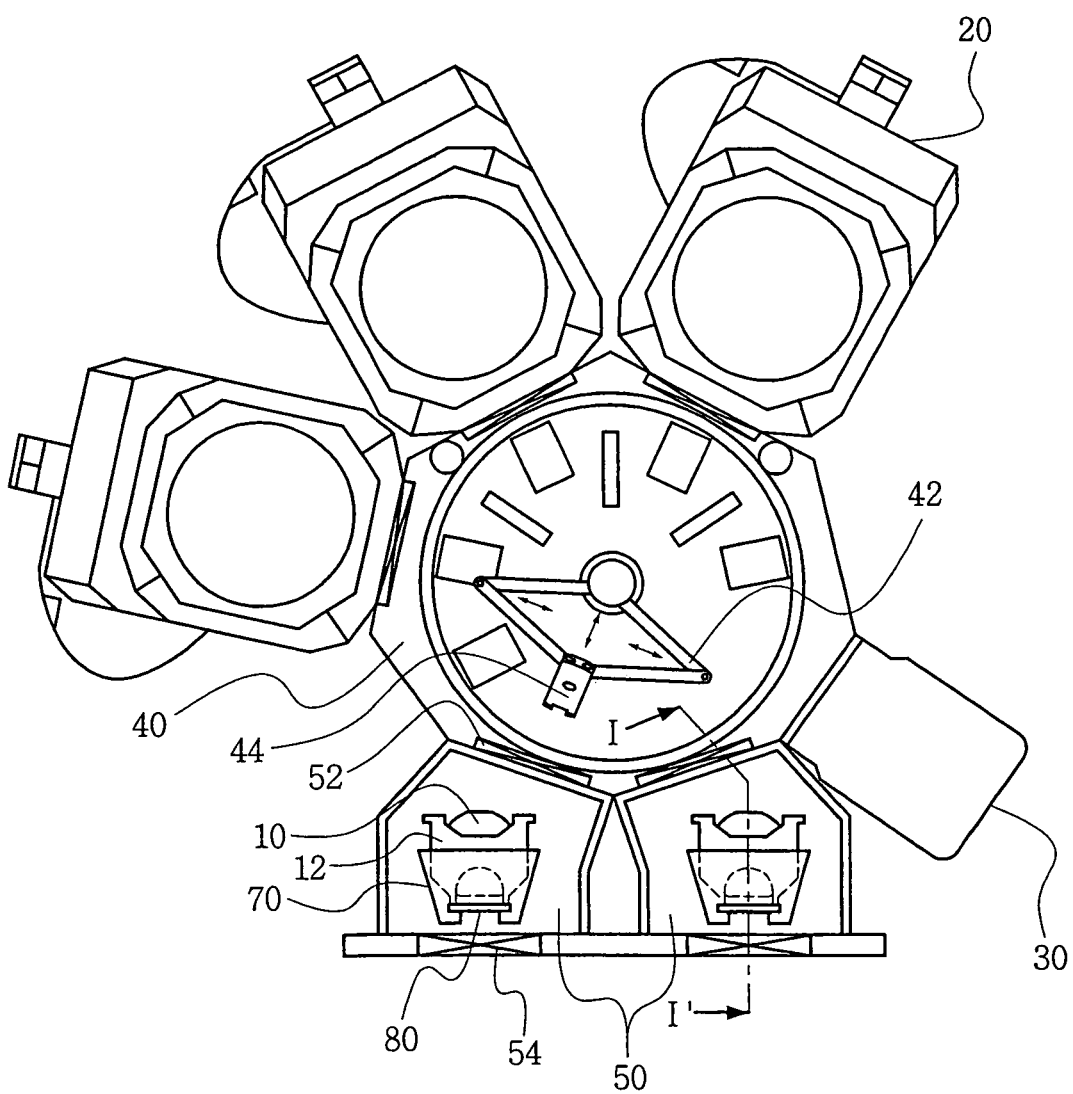
FIG. 1 is a schematic plan view of a first embodiment of semiconductor device manufacturing equipment according to the present invention.
Figure 2:
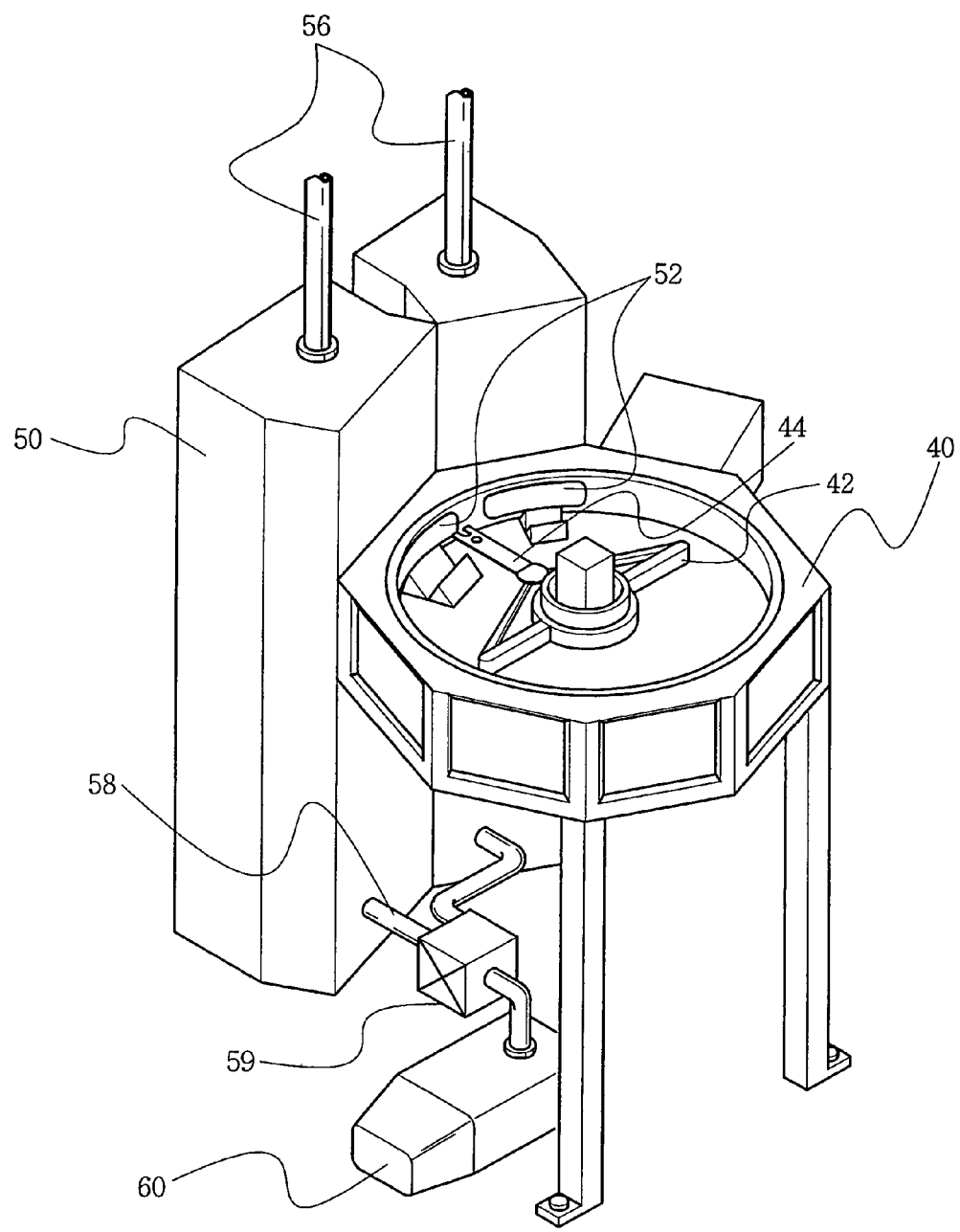
FIG. 2 is a perspective view of the load-lock chambers and transfer chamber of the first embodiment of FIG. 1.

Referring to FIGS. 1 to 4, a first embodiment of semiconductor device manufacturing equipment according to the present invention includes at least one process apparatus having a process chamber 20 in which a semiconductor manufacturing process is performed on at least one wafer 10 at a time, an alignment apparatus 30 that aligns the wafers 10 so that the flat zones of the wafers all face in one direction, at least one load-lock chamber 50, and a transfer chamber 40 in which a robot arm 42 is disposed for transferring the wafers 10 between the chambers. A slit valve 52 is interposed between one side of the load-lock chamber 50 and the transfer chamber 40. The slit valve 52, when opened, defines a passageway through which the robot arm 42 can pass to transfer a wafer from and/or back into the load-lock chamber 50. A door 54 is disposed at the side of the load-lock chamber 50 opposite the slit valve 52. The door 54 is large enough to allow a wafer cassette 12 to be transferred therethrough into and out of the load-lock chamber 50. The wafer cassette 12 supports a plurality of the wafers 10. A controller (not shown) controls the operation of the various parts of the equipment including the robot arm 42 and the slit valve 52.

The front and back of the wafer cassette 12 are open. The open front faces the slit valve 52 through which wafers 10 are transferred into and out of the load-lock chamber by the robot arm 42. The open back of the cassette 12 faces the inner rear wall of the load-lock chamber 50, e.g., the inner wall of the door 54, opposite the slit valve 52. Furthermore, the inner walls of the wafer cassette 12 define a plurality of slots that support the wafers 10 parallel to one another and space the wafers 10 vertically at regular intervals.

In this respect, a wafer aligner (not shown) disposed outside the load-lock chamber 50 includes a rod that is rotatable in one direction about its longitudinal axis. The rod is inserted against the wafers 10 at the open back of the wafer cassette 12. Rotation of the rod rotates the wafers 10 within the slots of the cassette 12 until the flat zones of the wafers 10 arrive at the rod. Hence, the flat zones of the wafers 10 are aligned.

Furthermore, the semiconductor device manufacturing equipment includes a purge gas supply line 56 connected to an upper portion of each load-lock chamber 50, and an exhaust line 58 connected to a lower portion of each load-lock chamber 50. Purge gas is supplied into the load-lock chamber 50 through the purge gas supply line 56. On the other hand, gas is pumped out of each load-lock chamber 50 through the exhaust line 58 by a vacuum pump 60. The vacuum pump 60 may be a dry pump or a rotary pump capable of creating a pressure as low as about $1 \times 10^{-3}$ Torr in each load-lock chamber 50.

In addition, the semiconductor device manufacturing equipment includes at least one anti-eddy cover 80 that is disposed over the back side of the wafer cassette 12 facing the door 54 or the interior wall of the load-lock chamber 50 in which the door 54 is formed. The anti-eddy cover 80 prevents particles from contaminating the wafers 10 in the load-lock chamber 50, as will be described in more detail later on.

The process chamber 20 of each process apparatus is a hermetically sealed chamber in which an individual process, such as a deposition process, an etching process, or an ashing process, is performed. For instance, one process apparatus may be a physical vapor deposition apparatus or a chemical vapor deposition apparatus for forming a thin film on a wafer 10. One process apparatus may also be a dry etching apparatus for etching a surface of the wafer 10 or the thin film using an etch mask, for example a photoresist pattern, and a reaction gas. Furthermore, one process apparatus 20 may be an ashing apparatus for oxidizing and removing the photoresist pattern after the dry etching process. Also, the deposition, etching and ashing apparatus may all be plasma processing apparatus in which reaction gas is converted to plasma to process the wafers 10.

In any case, a vacuum is maintained in the process chamber 20 of each process apparatus. For example, a wafer 10 is loaded into the process chamber 20 and set on a chuck (not shown) or a susceptor provided at the bottom of the process chamber. At this time, a high degree of vacuum of about $1 \times 10^{-6}$ Torr is created in the process chamber. Reaction gas is supplied into the process chamber, a plasma reaction is induced, and the wafer 10 is subjected to a deposition or etching process in a vacuum of between about $1 \times 10^{-3}$ Torr and about $1 \times 10^{-1}$ Torr. For example, the reaction gas in the case of a deposition process may be $NH_4$—$SiH_4$, $SiCl_4$—H or $TiCl_4$. In the case of an etching process the reaction gas may be a highly acidic etching gas such as $CF_4$, $C_2F_6$, $CHF_3$, $CH_2F_2$, $CClF_3$, $CBrF_3$, $CCl_4$, $SF_6$, $Cl_2$ or HBr. The reaction gas may be introduced alone or with a purge gas, such as Ar or $N_2$, an inert gas, and an active gas such as $H_2$ or $O_2$. Subsequently, the reaction gas facilitating the deposition or etching process is displaced with a post reaction gas and is discharged from the process chamber 20. The post reaction gas has a large highly acidic component, e.g., has a large amount of HCl, HF, $CH_4$ or $H_2SO_4$, and is discharged in a vapor phase from the process chamber 20. Nevertheless, as a result, a strong acid solution may remain on the surface of the wafer 10 in the process chamber or as residue on the thin film formed of the wafer 10. Furthermore, some of the non-reacted reaction gas may be absorbed by a substance on the wafer 10 such as by photoresist.

Accordingly, the processed wafer 10 is transferred from the process chamber 20 to a load-lock chamber 50 via the transfer chamber 40 where the highly acidic solution or the reaction gas remaining on the wafer 10 is allowed to evaporate or diffuse. At this time, a predetermined degree of vacuum is maintained in both the transfer chamber 40 and the load-lock chamber 50. However, the walls of the transfer chamber 40 and load-lock chamber 50 are formed of metal such as steel or SUS. Therefore, the fumes corrode inner surfaces of the walls of the transfer chamber 40 and/or the load-lock chamber 50, thereby producing potential contaminants. In addition, the wafer 10 is held in a standby state in the load-lock chamber 50 and therefore, spends more time in the load-lock chamber 50 than in the transfer chamber 40. Thus, more potential contaminants are produced along the inner wall surfaces of the load-lock chamber 50 than along the inner wall surfaces of the transfer chamber 40.

Obviously then, the contamination of the transfer chamber 40 is proportional to the time it takes the robot arm 42 to remove the wafer 10 from the process chamber 20 and transfer the wafer 10 to the load-lock chamber 50. Also, after a process has been completed in the process chamber 20, the slit valve between the process chamber 20 and the transfer chamber 40 is opened to allow the robot arm 42 to take the wafer 10 out of the process chamber 20. At this time, the degree of vacuum in the process chamber 20 is set to be higher than that in the transfer chamber 40. Thus, the air in the transfer chamber 40 is allowed to flow into the process chamber 20, and the air in the process chamber 20 is prevented from flowing into the transfer chamber 40, so that the contamination of the transfer chamber 40 can be minimized. Furthermore, the slit valve leading into the process chamber 20 is closed while the robot arm 42 transfers the wafer 10 from the transfer chamber 40 to the load-lock chamber 50. At this time, the robot arm 42 rotates to place the wafer 10 in front of the load-lock chamber 50, and the slit valve 52 between the load-lock chamber 50 and the transfer chamber 40 is opened. Also, the degree of vacuum in the load-lock chamber 50 is set to be higher than that in the transfer chamber 40. Accordingly, air in the load-lock chamber 50 is prevented from flowing into the transfer chamber 40, so that the contamination of the transfer chamber 40 can be minimized. To summarize, the degree of vacuum in the transfer chamber 40 is set to be lower than that in the process or load-lock chamber 20 or 50. Therefore, reaction gas and air flow toward the process or load-lock chamber 20 or 50 during the transfer of a wafer from the process chamber 20 to the load-lock chamber 50 so that a minimal amount of any particles contained in the reaction gas and air are introduced into the transfer chamber 40.

Then, the robot arm 42 transfers the wafer 10 through the slit valve 52, interposed between the transfer chamber 40 and the load-lock chamber 50, and into a wafer cassette 12 disposed in a load-lock chamber 50. Then, the robot arm 42 transfers another wafer 10 from a wafer cassette 12 into the transfer chamber 40, and the slit valve 52 is closed. This process is repeated until all of the wafers 10 are processed.

The processed wafers 10 stand by in the wafer cassette 12 until the last wafer 10 is transferred to the process chamber(s) 20 and is processed therein. Thus, the first ones of the processed wafers 10 stand by in the wafer cassette 12 for a long period of time. A strong acid solution or substance remaining on the wafers 10 evaporates during this time. Therefore, large amounts of fumes are dispersed within the load-lock chamber 50 and corrode the inner walls of the load-lock chamber 50. As a result, large quantities of potential contaminants accumulate on the inner walls of the load-lock chamber 50 compared to the amount of potential contaminates that accumulate on the inner walls of the transfer chamber 40.

At this time, the contaminants may be separated from the inner walls of the load-lock chamber 50 and transfer chamber 40 by the flow of gas or eddies created in each chamber. Thus, the resultant particles must be pumped out of the transfer chamber 40 and the load-lock chamber 50 through the exhaust line 58. Otherwise the particles will be deposited on the wafers 10 that are standing by in the load-lock chamber 50 or will enter the transfer chamber 40. Therefore, the vacuum pressure in the load-lock chamber 50 is regulated so as to be equal or similar to that in the transfer chamber 40. Therefore, the fumes and particles are pumped out of the load-lock chamber 50 and transfer chamber 40.

However, the vacuum pressure in the transfer chamber 40 is regulated to be equal or similar to that in the process chamber 20 before the slit valve between the process chamber 20 and the transfer chamber 40 is opened. As a result, the vacuum pressure in the load-lock chamber 50 becomes different from that in the transfer chamber 40. Once the wafer 10 has been transferred into the transfer chamber 40, the slit valve between the process chamber 20 and the transfer chamber 40 is closed. If, at this time, the vacuum pressure in the load-lock chamber 50 were adjusted to be equal or similar to that in the transfer chamber 40 before the slit valve 52 were opened, the wafer 10 would have to stand by in the transfer chamber 40 for a long period of time, which would adversely impact the productivity of the manufacturing process. Thus, the slit valve 52 is preferably opened and closed in a state in which the vacuum pressure in the load-lock chamber 50 remains different from that in the transfer chamber 40.

On the one hand, the vacuum pressure in the load-lock chamber 50 may be lower than that in the transfer chamber 40. In this case, large quantities of the particles and fumes in the load-lock chamber 50 can be introduced into the transfer chamber 40 when the slit valve 52 is opened. The particles and fumes could be pumped out of the transfer chamber 40 through the exhaust line 58 of the load-lock chamber 50 or the exhaust line (not shown) of the process chamber 20. However, the transfer chamber 40 communicating with the load-lock chamber 50 would be contaminated with the fumes and/or particles, in which case the semiconductor device manufacturing equipment would operate with poor efficiency and the maintenance necessary to rid the transfer chamber 40 of potential contaminants would be onerous. For example, it would take a long time to purge the transfer chamber 40 because the transfer chamber 40 has a relatively large volume, i.e., a volume that is much larger than that of the load-lock chamber 50. Moreover, the lifespan of the robot arm 42 disposed in the transfer chamber 40 is reduced by contamination.

On the other hand, the vacuum pressure in the load-lock chamber 50 may be higher than that in the transfer chamber 40. In this case, the air in the transfer chamber 40 flows into the load-lock chamber 50 when the slit valve 52 is opened. Thus, significant amounts of particles and fumes are not introduced into the transfer chamber 40 from the load-lock chamber 50. Rather, the fumes in the load-lock chamber 50 are diluted with air from the transfer chamber 40.

However, the air or gas that flows into the load-lock chamber 50 has the potential to accelerate the contamination of the inner walls of the load-lock chamber 50 by generating currents or eddies and dispersing fumes within the load-lock chamber 50 onto the inner walls of the load-lock chamber 50. In addition, the air flow and/or eddies could release contaminants from the inner walls of the load-lock chamber, thereby generating large quantities of particles in the load-lock chamber 50. In general, the current or eddy is strongest to the rear of the wafer cassette 12 where the space between the cassette and the door 54 is narrower than the space between the front of the cassette and the front wall of the load-lock chamber 50.

In light of this, the first embodiment of the semiconductor manufacturing equipment according to the present invention also includes the anti-eddy cover 80. The anti-eddy cover 80 covers the opening at the back of the wafer cassette 12 to prevent gas flowing into the wafer cassette 12 at the front thereof from flowing out through the back of the wafer cassette 12. Accordingly, the rate at which fumes emanate from the wafers 10 in the wafer cassette 12 is not accelerated. Also, the fumes emanating from the wafers 10 are not dispersed toward inner walls of the load-lock chamber 50, e.g., are not dispersed onto the inner wall of the door 54 or the inner side walls of the load-lock chamber 50. Rather, the fumes are exhausted out of the front of the cassette 12 and through the exhaust line 58. As a result, the anti-eddy cover 80 minimizes the release of particles from the inner walls of the load-lock chamber 50 and hence, mitigates the contamination of the wafers 10. Preferably, the anti-eddy cover 80 is formed of plastic, such as a plastic of the acryl group, having excellent corrosion resistance against the strong acid fumes and which is transparent so that the wafers 10 can be observed from the rear side of the wafer cassette 12.

Figure 3:
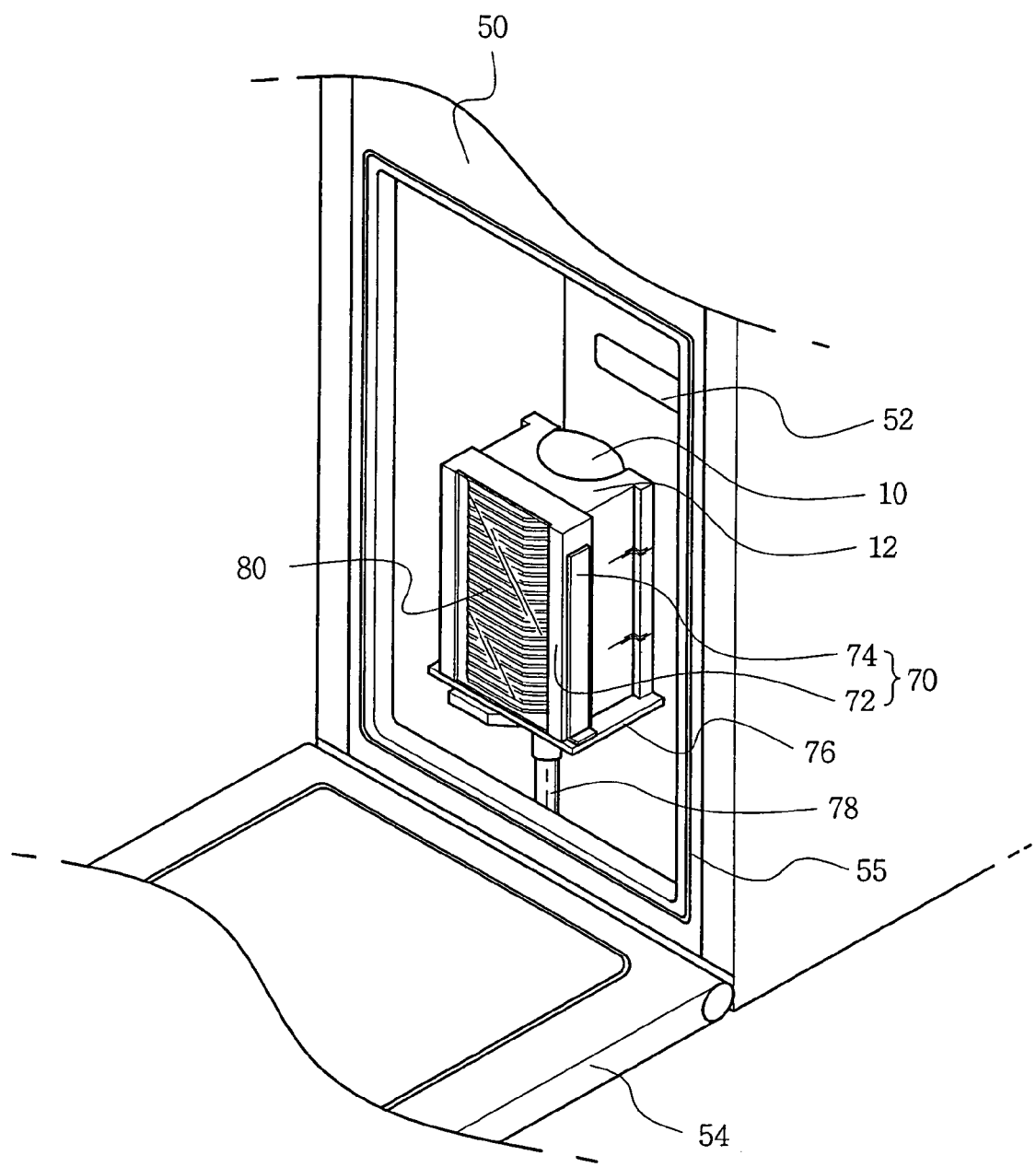
FIG. 3 is a perspective view of the front portion of a load-lock chamber of the first embodiment of FIG. 1.
Figure 4:
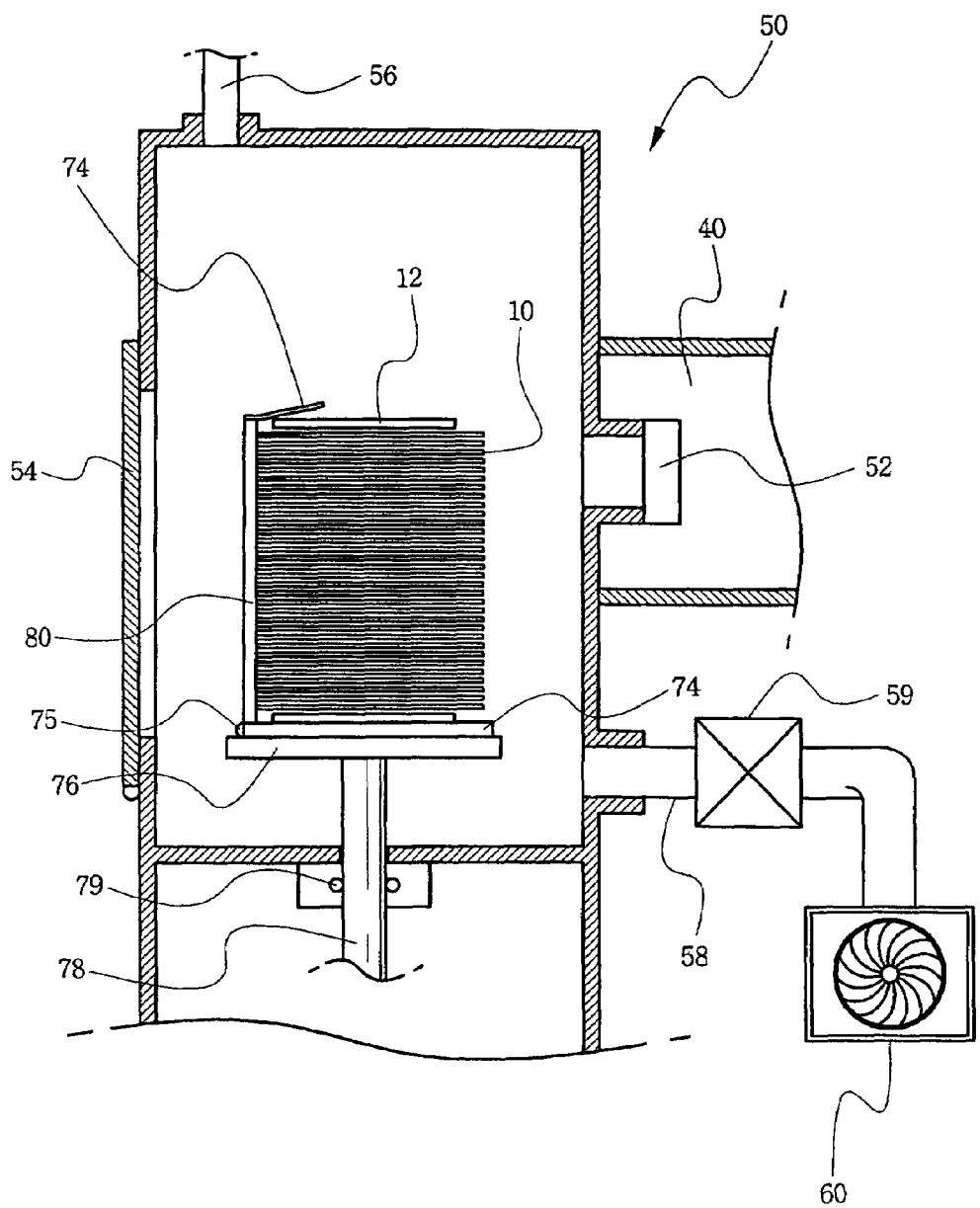
FIG. 4 is a sectional view taken along line I-I of FIG. 1.
Figure 5:
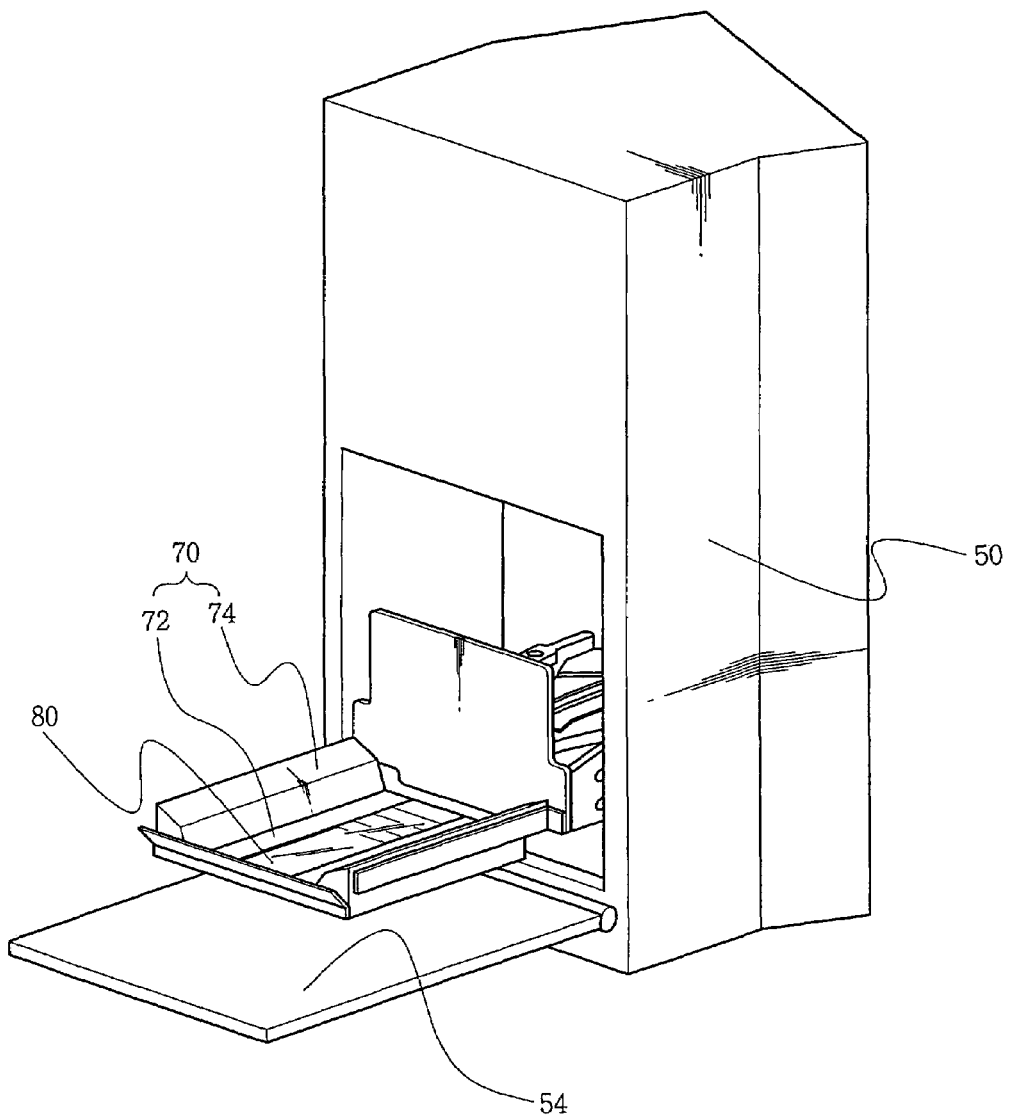
FIG. 5 is a perspective view of the load-lock chamber, showing a cassette holder.
Figure 6:
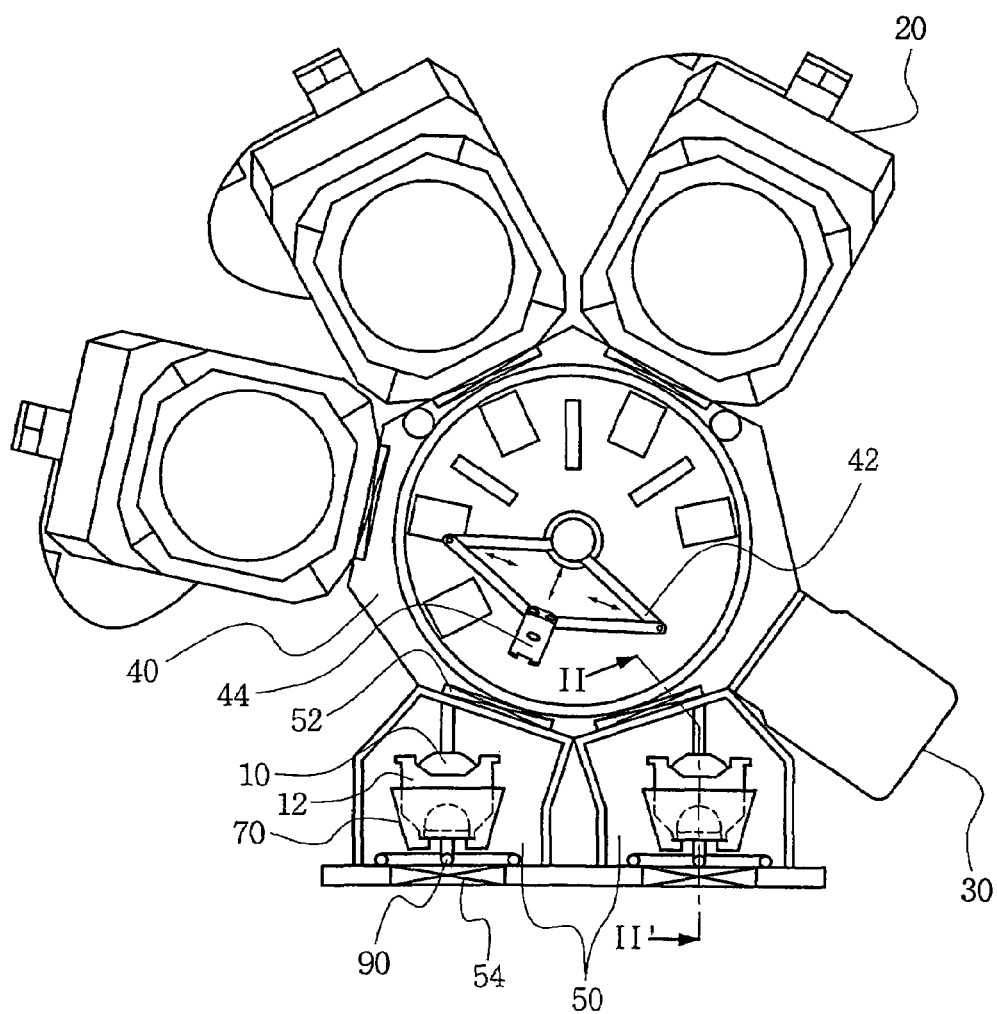
FIG. 6 is a schematic plan view of a second embodiment of semiconductor manufacturing equipment according to the present invention.
Figure 7:
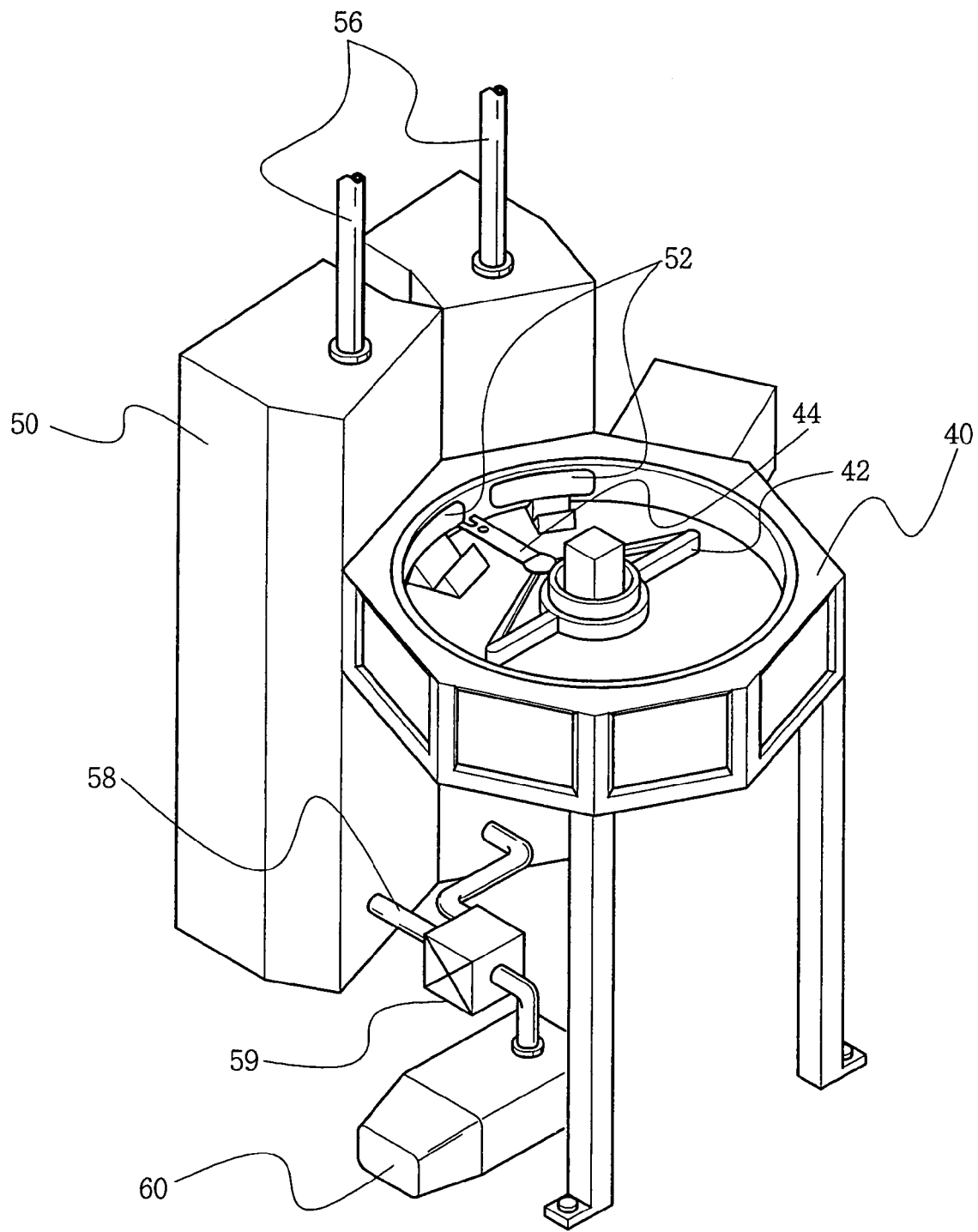
FIG. 7 is a perspective view of the load-lock chambers and transfer chamber of the second embodiment of FIG. 6.

Now, the semiconductor device manufacturing equipment in accordance with the present invention will be described in more detail with reference to FIGS. 3 through 5.

The load-lock chamber 50 has a front wall adjacent to the slit valve 52 and a rear wall opposite to the slit valve 52. The lower end of the door 54 is pivotally mounted to the rear wall of the load-lock chamber 50 so that the door 54 can be swung open or closed. More specifically, the door 54 extends perpendicular to the ground and is coupled to the outer wall of the load-lock chamber 50 when the door 54 is closed. To this end, the load-lock chamber has a metal latch (not shown) for securing the upper end of the door 54 to the outer wall. On the other hand, the door 54 extends parallel to the ground when the door 54 is open so as to allow the wafer cassette 12 to be inserted into or withdrawn from the load-lock chamber 50. Preferably, the door 54 is a metal door. Furthermore, a first rubber O-ring 55 extends along the periphery of the door 54 in, for example, the rear wall of the load-lock chamber 50 to prevent gas from leaking from the chamber past the door 54 when the door is closed.

The semiconductor device manufacturing equipment also includes a cassette holder or a handler 70 configured to receive and support the wafer cassette 12, and an elevator 76 for moving the wafer cassette 12 supported by the cassette holder 70 vertically so as to allow each wafer 10 to be removed from the wafer cassette 12 by the robot arm 42 and transferred from the load-lock chamber 50 through the slit valve 52. The elevator 76 includes a platform on which the cassette handler 70 is mounted, and a lifter rod 78 supporting the platform. The lifter rod 78 projects into the load-lock chamber 50 through a hole in a bottom wall of the load-lock chamber 50. An O-ring 79 is disposed against the outer circumferential surface of the lifter rod 78 adjacent the hole in the bottom wall of the load-lock chamber 50 so as to seal the interior of the load-lock chamber 50 from the space below the chamber. The lifter rod 78 is driven by a motor disposed in the space beneath the load-lock chamber 50 to move the platform of the elevator 76 and hence, the cassette holder 70 and wafer cassette 12 up and down in the load-lock chamber 50. No external air penetrates into the load-lock chamber 50 during this time due to the seal created by the O-ring 79.

The cassette holder 70 includes a plurality of support plates 72 that are configured to support the back of the wafer cassette 12 when the wafer cassette 12, which is transferred by an automatic or manual transfer system while the door 54 is opened, is located on the upper portion of the door 54. Furthermore, the cassette holder 70 further includes a plurality of guide plates 74 that are formed to surround the side surfaces of the wafer cassette 12 as well as upper and lower ends of the rear face of the wafer cassette 12. The cassette holder 70 is mounted to a pivot 78 fixed to the platform of the elevator 76, thereby enabling the cassette holder 70 to rotate in the same direction as the door 54. More specifically, the cassette holder 70 can be rotated about the pivot 78 between a first (horizontal) position as shown in FIG. 5 and a second (upright) position as shown in FIG. 4.

The cassette holder 70 is pivoted to the first position when the door of the load-lock chamber 50 is opened. At this time, a wafer cassette 12 can be placed on the cassette holder 70 with the back of the wafer cassette 12 face down. The anti-eddy cover 80 extends between the guide plates 72 so as to cover the opening defined by the back of the wafer cassette 12 when the wafer cassette 12 is placed on the cassette holder 70.

Then, the cassette holder 70 is pivoted to the second (upright) position, as the door 54 is closed, to stand the wafer cassette 12 up in the load-lock chamber 50. At this time, the wafers 10 become oriented horizontally. Furthermore, the door 54 is coupled to and hermetically seals the rear wall of the load-lock chamber 50. Then the load-lock chamber 50 is evacuated through the exhaust line 58 until a predetermined vacuum pressure of about $3 \times 10^{-3}$ Torr prevails in the load-lock chamber 50. To this end, a vacuum sensor (not shown) extends into the load-lock chamber 50 through a port in a side wall of the load-lock chamber 50 for sensing the degree of vacuum in the load-lock chamber 50. For example, the vacuum sensor may comprise a Baratron gauge that determines the pressure in the load-lock chamber by comparing that pressure to a reference pressure using a baffle, or a Pirane gauge that operates on the principle that at low pressures the thermal conductivity of gas is substantially proportional to the degree of vacuum (pressure of residual gas). Furthermore, a pressure regulator valve 59 is disposed in the exhaust line 58. The pressure regulator valve 59 receives the signal output from the vacuum sensor, and regulates the flow of the air being pumped out of the load-lock chamber by the vacuum pump 60 so that the predetermined vacuum pressure is produced in the load-lock chamber 50.

Thus, the pressure regulator valve 59 is initially closed while the door 54 of the load-lock chamber 50 is open, and is then opened once the door 54 has been closed. More specifically, the pressure regulator valve 59 is slightly opened to allow only a small quantity of air to be pumped through the exhaust line 58 by the vacuum pump 60. This prevents a strong air current or an eddy from being produced in the load-lock chamber in the early stage of the evacuation process when a low degree of vacuum exists in the load-lock chamber 50. The pressure regulator valve 59 is opened further as the degree of vacuum in the load-lock chamber 50 increases, i.e., as the air in the load-lock chamber 50 becomes thinner, to maintain the rate at which air is evacuated from the chamber. At this time, the lower front portion of the load-lock chamber 50 to which the exhaust line 58 is connected has a lower pressure than the remainder of the load-lock chamber 50. In particular, the pressure between the front of the wafer cassette 12 and the front wall of the load-lock chamber 50 differs from the pressure between the back of the wafer cassette 12 and the rear wall of the load-lock chamber 50. A strong air current or eddy is produced due to this pressure difference.

Accordingly, the strong air current or eddy causes contaminants to separate from the inner walls of the load-lock chamber 50 and thereby form particles. The particles which are produced at the lower portion of the load-lock chamber 50 and the inner surface of the front wall of the load-lock chamber 50 flow to the exhaust line 58. Also, the particles which are produced at the inner surface of the door 54 and at the inner surface of the rear wall of the load-lock chamber 50 flow to the exhaust line 58 without entering the wafer cassette 12 because the anti-eddy cover 80 covers the back of the wafer cassette 12.

Furthermore, purge gas is supplied (from a source not shown) into the load-lock chamber 50 through the purge gas supply line 56 once the predetermined degree of vacuum is established in the load-lock chamber 50. For example, the purge gas is supplied into the load-lock chamber 50 at a rate of several to several tens of sccm. At this time, the purge gas entrains the particles produced in the load-lock chamber 50 and dilutes any fumes therein and is then discharged through the exhaust line 58.

A pressure difference is generated between the upper and lower portions of the load-lock chamber 50 when the purge gas is supplied into the load-lock chamber 50 through the purge gas supply line 56. Thus, a weak air current or an eddy is generated. As a result, contaminants are separated from the inner wall surfaces of the load-lock chamber 50, thereby forming particles within the load-lock chamber. The particles which are produced between the front of the wafer cassette 12 and the inner surface of the front wall of the load-lock chamber 50 are pumped through the exhaust line 58 directly. The particles which are produced at the inner wall surface of the door 54 or at the inner surface of the rear wall of the load-lock chamber 50 are prevented from entering the wafer cassette 12 by the anti-eddy cover 80, and thus flow along the anti-eddy cover 80 or the wafer cassette 12 to the lower portion of the load-lock chamber 50. Then, the particles are discharged through the exhaust line 58.

Although not shown, a wafer sensor for sensing the presence of wafers in the wafer cassette 12. The wafer sensor may be disposed within the load-lock chamber 50 or may be disposed outside of the load-lock chamber to sense for the presence of wafers in the cassette through a port in the load-lock chamber 50. The wafer sensor includes a light source for generating light such as infrared light, an emitter for emitting the light generated by the light source towards a location where a wafer 10 should be supported in the wafer cassette 12, a light receiver positioned to receive the light reflected from a wafer is the wafer is present in the wafer cassette 12, and a light converter for converting the reflected light received by the light receiver into an electrical signal and outputting the signal to the controller for controlling the slit valve 52 and robot arm 42. The emitter may be disposed on the inner surface of the front wall of the load-lock chamber 50 as facing the front of the wafer cassette 12, and the light receiver may be disposed on the inner surface of the rear wall of the load-lock chamber 50 as facing the back of the wafer cassette 12. The infrared emitted by the emitter at the front of the wafer cassette 12 can be reflected off of a wafer in the wafer cassette 12 and received by the light receiver at the back of the wafer cassette 12 because the anti-eddy cover 80 is transparent.

Also, the wafer sensor can be supported so as to be movable vertically within the load-lock chamber 50 to sequentially sense for the presence of wafers in the wafer cassette 12. Alternatively, the wafer sensor may be fixed in place in the load-lock chamber 50. In this case, the wafer sensor can sense for the presence of a wafer at a fixed location in the load-lock chamber 50 as the wafer cassette 12 moves up and down.

Next, the transfer of wafers from the load-lock chamber 50 into the transfer chamber 40 will be described. First, the wafer cassette 12 is raised until an uppermost wafer 10 supported therein is level with the slit valve 52. The presence of the wafer 10 is confirmed by the wafer sensor either before or at the time the wafer 10 arrives at the level of the slit valve 52. Then, the slit valve 52 is opened so as to enable the robot arm 42 in the transfer chamber 40 to take the wafer 10 out of the wafer cassette 12. At this time, the degree of vacuum in the load-lock chamber 50 is higher than that in the transfer chamber 40. Thus, gas in the transfer chamber 40 is introduced into the load-lock chamber 50 through the slit valve 52.

In this case, the gas is prevented by the anti-eddy cover 80 from flowing through the wafer cassette 12 to the door 54 or the inner surface of the rear wall of the load-lock chamber 50. Therefore, the creation of particles at the inner surface of the door 54 or the inner surface of the rear wall of the load-lock chamber 50 is suppressed. At this time, the gas blocked by the anti-eddy cover 80 is induced to flow back out of the cassette 12 and through the space between the front of the wafer cassette 12 and the front wall of the load-lock chamber 50, and is discharged through the exhaust line 58 connected to the bottom of the load-lock chamber 50. On the other hand, a small amount of the gas flowing into the load-lock chamber 50 through the slit valve 52 flows through the space between the top of the wafer cassette 12 and the top wall of the load-lock chamber 50, and then along the inner surface of the door 54, the inner surface of the rear wall of the load-lock chamber 50, the side walls of the wafer cassette 12 and/or the anti-eddy cover 80. This gas is then discharged through the exhaust line 58.

On the other hand, if the degree of vacuum in the load-lock chamber 50 is lower than that in the transfer chamber 40, the gas in the load-lock chamber 50 is introduced into the transfer chamber 40. At this time, the pressure at the front of the load-lock chamber 50 where the slit valve 52 is located is lower than the pressure at the back of the load-lock chamber 50. Such a pressure difference in the load-lock chamber 50 can generate a current or eddy. As discussed above, a relatively strong current or eddy is generated at the back of the wafer cassette 12. Regardless, the current or eddy is blocked by the anti-eddy cover 80. Thus, the wafers 10 are prevented from being contaminated with particles produced by and entrained in the current or eddy.

Once the slit valve 52 has been opened, a blade 44 of the robot arm 42 enters the load-lock chamber 50 through the slit valve 52, receives a wafer 10 supported in the wafer cassette 12, and transfers the wafer 10 to the transfer chamber 40. The load-lock chamber 50 and the transfer chamber 40 have equal or similar pressures during the transfer such that equilibrium exists. Thus, very little, if any, gas flows through the slit valve 52.

The slit valve 52 is closed once the wafer 10 has been transferred into the transfer chamber 40 by the robot arm 42. Next, the robot arm 42 loads the wafer 10 into the alignment apparatus 30. The alignment apparatus 30 has a rotary chuck (not shown) that supports and rotates the wafer 10, and an alignment sensor (not shown) that is provided above the rotary chuck at the periphery thereof so as to sense the flat zone of the wafer 10 supported and rotated by the rotary chuck. The wafer 10 is oriented (aligned) by the alignment apparatus 30 so that the flat zone of the wafer faces in a given direction.

Subsequently, the robot arm 42 transfers the wafer 10 into one of the process chambers 20, and a semiconductor manufacturing process is performed on the wafer 10. Once the wafer has been transferred into the process chamber 20, the robot arm 42 takes another wafer 10 out of the load-lock chamber 50, loads the wafer 10 into the alignment apparatus 30 whereupon the wafer 10 is aligned, and loads the aligned wafer 10 into another process chamber 20. This process may be repeated depending on the number and type of the process chambers 20.

Once a particular semiconductor manufacturing process is completed in the process chamber 20, the robot arm 42 removes the wafer 10 from the process chamber 20, and transfers the wafer 10 into a load-lock chamber 50. At this time, the slit valve 52 associated with the load-lock chamber 50 is opened, and then the processed wafer 10 is loaded into the wafer cassette 12 in the load-lock chamber 50. At this time, gas may flow through the slit valve 52 due to the pressure difference between the load-lock chamber 50 and the transfer chamber 40. However, as mentioned above, the anti-eddy cover 80 suppresses the formation of a current or eddy, as well as minimizes the contamination of the wafer 10 by particles produced as the result of the separation of contaminants from the walls of the load-lock chamber 50 by a current or eddy.

Subsequently, the blade 44 of the robot arm 42 is retracted into the transfer chamber 40, and the wafer cassette 12 is raised. Thus, the next wafer 10 on which the semiconductor manufacturing process will be performed is positioned level with the slit valve 52. Next, the blade 44 of the robot arm 42 removes the wafer 10 from the wafer cassette 12, and transfers the wafer 10 through the slit valve 52 from the load-lock chamber 50 to the transfer chamber 40. Then, the slit valve 52 is closed. The above-described operations are repeated until all of the wafers 10 in a wafer cassette 12, typically 25 wafers, have been processed and returned to a wafer cassette.

Thus, a strong acid solution or absorbed substance evaporates from the surface of the processed wafers 10 that have already been loaded into a wafer cassette in a load-lock chamber 50. The resulting fumes attack the inner walls of the load-lock chamber 50. As was described above, the anti-eddy cover 80 serves to minimize the corrosion of the door 54 and rear wall of the load-lock chamber 50 and prevent contamination of the wafers in the wafer cassette 12 by any particles produced in the load-lock chamber 50.

Furthermore, once all of the wafers have been processed and loaded into a wafer cassette 12, the door 54 of the load-lock chamber 50 is opened so that the wafer cassette 12 can be removed in preparation for the processing of another batch of wafers. However, purge gas is supplied into the load-lock chamber 50 through the purge gas supply line 56 before the door 54 is opened to bring the pressure in the load-lock chamber 50 to atmospheric pressure. Thus, a current or eddy of the purge gas is produced in the load-lock chamber 50 is proportionally increased. The current or eddy can remove contaminants from the door 54 and inner surfaces of the walls of the load-lock chamber and entrain the resulting particles. However, the anti-eddy cover 80 prevents the current or eddy entraining the particles from flowing into the wafer cassette 12 at the back of the wafer cassette 12. Thus, the anti-eddy cover 80 prevents local contamination of the wafers 10 near the flat zones of the wafers 10 that are exposed at the back of the wafer cassette 12.

In these respects, the anti-eddy cover 80 may be considered a wafer anti-contamination device.

FIGS. 6 to 10 illustrate a second embodiment of semiconductor device manufacturing equipment according to the present invention. Components of the second embodiment that are similar to those of the first embodiment are designated by like reference numerals and as such, a detailed description of such components will be omitted for the sake of brevity. For the same reason, much of the previously described operation of the semiconductor device manufacturing equipment will be omitted.

Like the first embodiment, the second embodiment of semiconductor device manufacturing equipment according to the present invention includes at least one process apparatus having a process chamber 20 in which a semiconductor manufacturing process is performed on at least one wafer 10 at a time, an alignment apparatus 30 that aligns the wafers 10 so that the flat zones of the wafers all face in one direction, at least one load-lock chamber 50, and a transfer chamber 40 in which a robot arm 42 is disposed for transferring the wafers 10 between the chambers. A slit valve 52 is interposed between one side of the load-lock chamber 50 and the transfer chamber 40. The slit valve 52, when opened, defines a passageway through which the robot arm 42 can pass to transfer a wafer from and/or back into the load-lock chamber 50. A door 54 is disposed at the side of the load-lock chamber 50 opposite the slit valve 52. The door 54 is large enough to allow a wafer cassette 12 to be transferred therethrough into and out of the load-lock chamber 50.

The wafer cassette 12 supports a plurality of the wafers 10. The front and back of the wafer cassette 12 are open. The open front faces the slit valve 52 through which wafers 10 are transferred into and out of the load-lock chamber by the robot arm 42. The open back of the cassette 12 faces the inner rear wall of the load-lock chamber 50, e.g., the inner wall of the door 54, opposite the slit valve 52. Furthermore, the inner walls of the wafer cassette 12 define a plurality of slots that support the wafers 10 parallel to one another and space the wafers 10 vertically at regular intervals.

Furthermore, the semiconductor device manufacturing equipment includes a purge gas supply line 56 connected to an upper portion of each load-lock chamber 50, and an exhaust line 58 connected to a lower portion of each load-lock chamber 50. Purge gas is supplied into the load-lock chamber 50 through the purge gas supply line 56. On the other hand, gas is pumped out of each load-lock chamber 50 through the exhaust line 58 by a vacuum pump 60. The vacuum pump 60 may be a dry pump or a rotary pump capable of creating a pressure as low as about $1 \times 10^{-3}$ Torr in each load-lock chamber 50.

Figure 8:
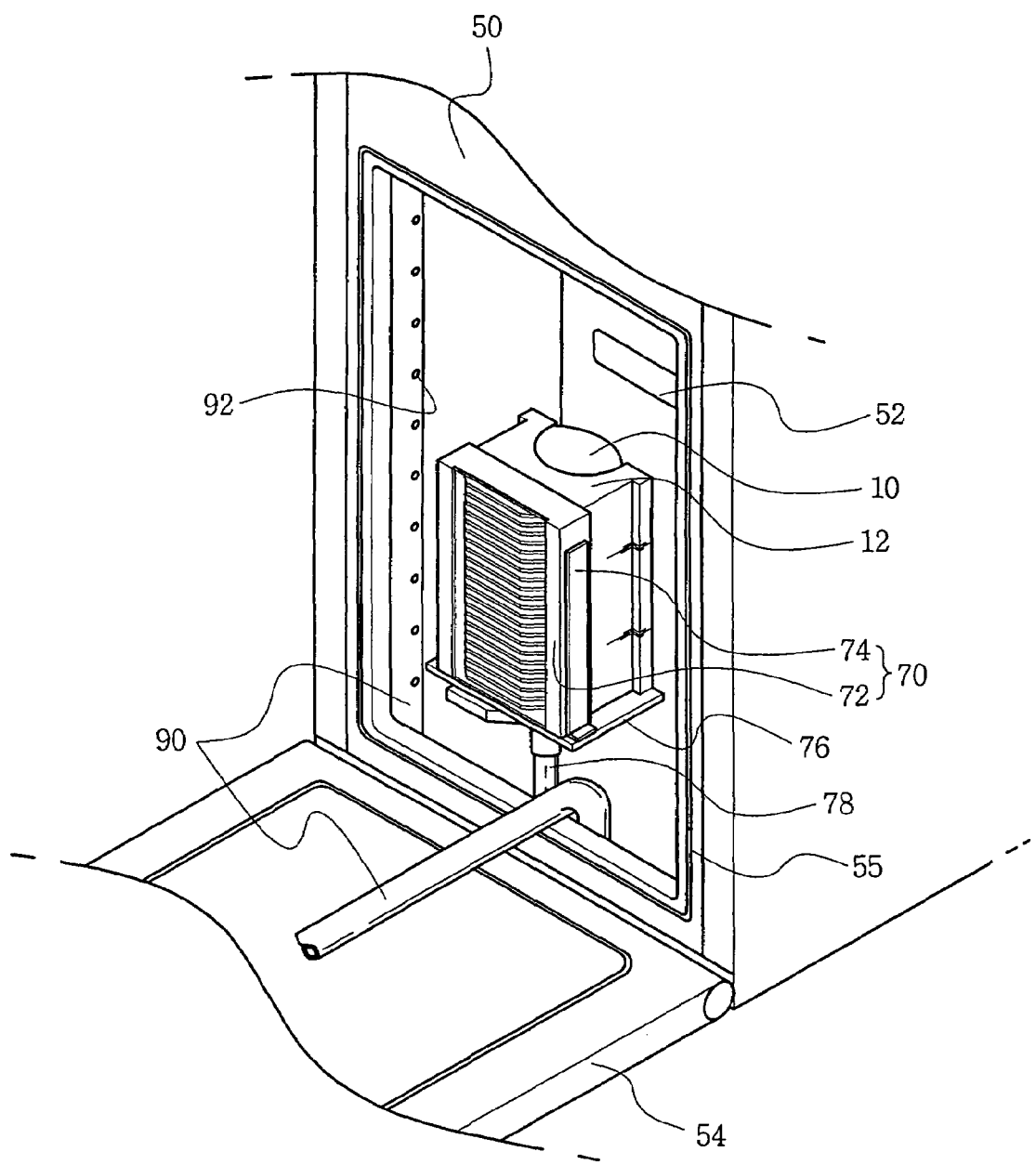
FIG. 8 is a front perspective view of a load-lock chamber of FIG. 6.
Figure 9:
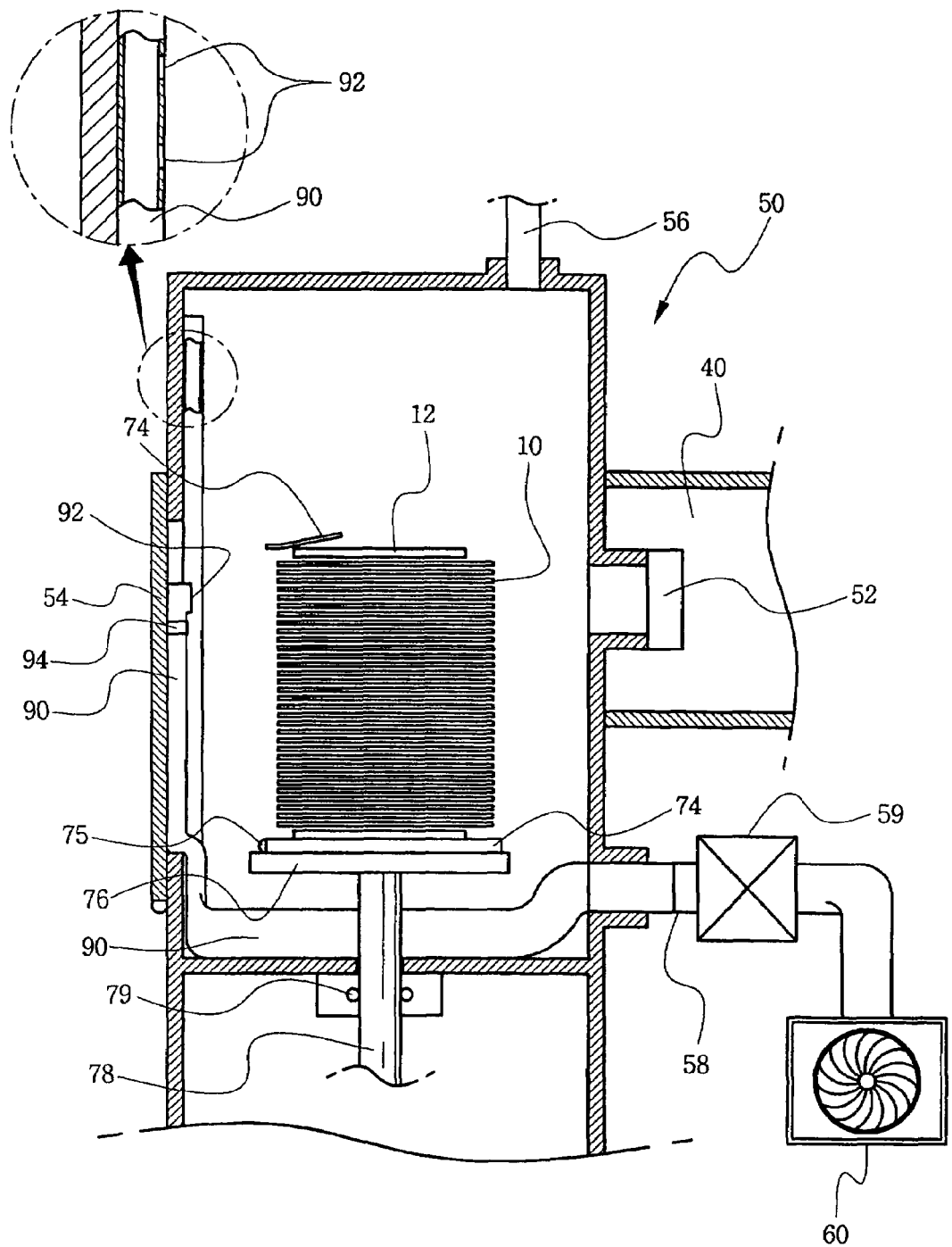
FIG. 9 is a cross-sectional view taken along line II-II of FIG. 6.
Figure 10:
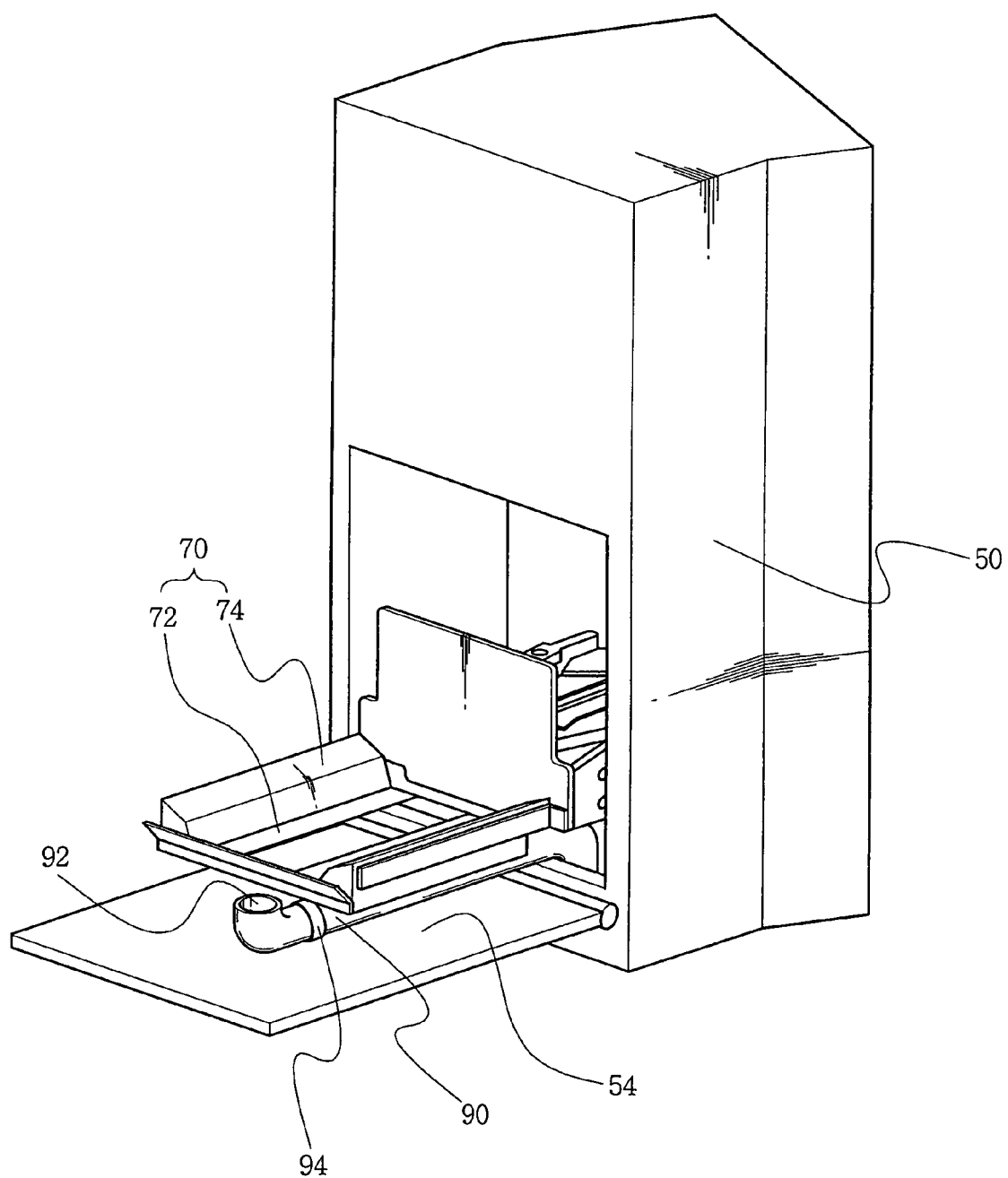
FIG. 10 is a perspective view of the load-lock chamber of FIG. 8 showing a cassette holder.

Still further, the equipment includes a cassette holder or a handler 70 (FIG. 10) configured to receive and support the wafer cassette 12, and an elevator 76 (FIG. 9) for moving the wafer cassette 12 supported by the cassette holder 70 vertically so as to allow each wafer 10 to be removed from the wafer cassette 12 by the robot arm 42 and transferred from the load-lock chamber 50 through the slit valve 52. The cassette holder 70 includes a plurality of support plates 72 that are configured to support the back of the wafer cassette 12 when the wafer cassette 12, which is transferred by an automatic or manual transfer system while the door 54 is opened, is located on the upper portion of the door 54. The cassette holder 70 further includes a plurality of guide plates 74 that are formed to surround the side surfaces of the wafer cassette 12 as well as upper and lower ends of the rear face of the wafer cassette 12. The cassette holder 70 is mounted to a pivot 78 fixed to the platform of the elevator 76, thereby enabling the cassette holder 70 to rotate in the same direction as the door 54. More specifically, the cassette holder 70 can be rotated about the pivot 78 between a first (horizontal) position as shown in FIG. 10 and a second (upright) position as shown in FIGS. 8 and 9.

A controller (not shown) controls the operation of the various parts of the equipment including the robot arm 42 and the slit valve 52.

However, unlike the first embodiment, the second embodiment of the semiconductor device manufacturing equipment also includes ductwork 90 coupled to the exhaust line 58 and extending along an inner surface of the door 54 and/or an inner surface of the rear wall of the load-lock chamber 50. The ductwork 90 distributes and intakes air introduced into the load-lock chamber 50 when the slit valve 52 is opened or the purge gas is supplied into the load-lock chamber 50 through the purge gas supply line 56. The ductwork 90 thus prevents the air or purge gas from developing into a strong current or eddy inside the load-lock chamber 50 to prevent contaminants from separating from inner surfaces of the load-lock chamber 50. Air or gas that entrains any such particles is also discharged through the ductwork 90. Hence, the ductwork 90 prevents wafers in the load-lock chamber 50 from being contaminated with particles. The ductwork 90 and its function will now be described in more detail.

The ductwork 90 extends into and is fastened to the exhaust line 58 connected to the lower portion of the load-lock chamber 50. To facilitate this, one end of the ductwork has an outer diameter equal to or less than the inner diameter of the exhaust line 58. Furthermore, the other end of the ductwork 90 includes at least one duct. For example, the ductwork 90 is branched at the lower portion of the load-lock chamber 50 so as to have three ducts. One of the ducts (a central duct) extends along the inner surface of the door 54, and the other (lateral) ducts extend along the inner surface of the rear wall of the load-lock chamber 50 on both sides of the door 54. In this regard, the ductwork 90 is formed of a flexible material (rubber, plastic, etc.) so that the central duct which extends along the inner surface of the door 54 is not damaged when the door 54 is opened and closed. The central duct also has a protrusion at a terminal end thereof, and the terminal end is secured to the door 54 with a clamp 94. Also, the material of the ductwork 90 has an excellent corrosion resistance against the fumes which can emanate from the wafers 10.

Furthermore, each duct has one or more intake openings 92. For example, each intake opening 92 may be disposed at the same level as the slit valve 52 as in the case of the duct disposed along the door 54. In the case in which the ductwork 90 has three ducts, the intake openings 92 disposed at the level of the slit valve 52 all have the same or similar diameters. Alternatively, as best shown in FIGS. 8 and 9, the intake openings 92 may be spaced along the length of the ductwork 90 from the upper portion to the lower portion of the rear wall of the load-lock chamber 50. In this case, the intake openings 92 located adjacent the level of the slit valve 52 have a higher density or total area greater than that of the intake openings 92 disposed at any of the other levels. Accordingly, air introduced through the slit valve 52 tends to flow basically directly across the load-lock chamber to the intake opening(s) of the ductwork 90.

More specifically, the air which is introduced through the slit valve 52 flows through the wafer cassette 12 and is discharged from the load-lock chamber 50 through the ductwork 90. At this time, the air flows over the surface of each wafer 10 in the wafer cassette 12, accelerates the evaporation occurring at the surface of each wafer 10, and is discharged through the ductwork 90 along with the vapors (fumes). Furthermore, even when the air containing the fumes flows to the door 54 or the rear wall of the load-lock chamber 50, corrodes the inner surface of the door 54 or the inner surface of the rear wall of the load-lock chamber 50, and thereby produces particles, the air entrains the particles and is discharged through the ductwork 90.

In this respect, the ductwork 90 may be considered a wafer anti-contamination device that can minimize the flow of fumes onto the inner surfaces of the door 54 and rear wall of the load-lock chamber, thereby suppressing their corrosion, and can prevent any contaminants that separate from such surfaces from flowing onto the wafers 10.

Now, the operation of the second embodiment of the semiconductor manufacturing equipment in accordance with present invention will be described in more detail.

The door of the load-lock chamber 50 is opened. At this time, the cassette handler 70 is pivoted to its first (horizontal) position. At this time, the central duct of the ductwork 90 is flexed so as to extend horizontally along with the door 54. Then, a wafer cassette 12 is placed on the cassette handler 70 with the back of the wafer cassette 12 face down.

Subsequently, the cassette holder 70 is pivoted to the second (upright) position, as the door 54 is closed, to stand the wafer cassette 12 up in the load-lock chamber 50. At this time, the wafers 10 become oriented horizontally. Also, the central duct of the ductwork 90 extends vertically with the protrusion thereof facing the slit valve 50. Furthermore, the door 54 is coupled to and hermetically seals the rear wall of the load-lock chamber 50. Then the load-lock chamber 50 is evacuated through the exhaust line 58 until a predetermined vacuum pressure of about $3 \times 10^{-3}$ Torr prevails in the load-lock chamber 50. As was described in connection with the first embodiment, a vacuum sensor (not shown) monitors the pressure in the load-lock chamber 50 and provides feedback to the controller so that the predetermined vacuum pressure can be established and maintained in the load-lock chamber 50.

During this time, air flows from the space at the front of the wafer cassette 12 to the relatively narrow space at the rear of the wafer cassette 12 and is discharged through the ductwork 90. The ductwork 90, which has a plurality of intake holes 92 spaced vertically along the inner surface of the rear wall of the load-lock chamber 50, produces less of a pressure gradient in the load-lock chamber 50 compared to a conventional load-lock chamber having only a single exhaust port at the bottom thereof. Accordingly, a strong current or eddy does not develop in the load-lock chamber 50 as the load-lock chamber 50 is being evacuated by the pump 60. Accordingly, few particles are produced in the load-lock chamber 50 at this time.

Some of the air, though, flows between the sides of the wafer cassette 12 and the inner surfaces of the side walls of the load-lock chamber 50. This air can dislodge contaminants from the side walls of the load-lock chamber 50. However, the resulting particles are discharged through the intake openings 92 of the ductwork 90 together with the air.

Furthermore, purge gas is supplied (from a source not shown) into the load-lock chamber 50 through the purge gas supply line 56 once the predetermined degree of vacuum is established in the load-lock chamber 50. For example, the purge gas is supplied into the load-lock chamber 50 at a rate of several to several tens of sccm. At this time, the purge gas entrains the particles produced in the load-lock chamber 50 and dilutes and fumes therein and is then discharged through the ductwork 90. Thus, the purge gas serves to prevent the contamination of the load-lock chamber 50.

However, a pressure difference is generated between the upper and lower portions of the load-lock chamber 50 when the purge gas is supplied into the load-lock chamber 50 through the purge gas supply line 56. Thus, a weak gas current or an eddy is generated.

Also, the purge gas flowing toward the narrow space between the back of the wafer cassette 12 and the inner surface of the door 54 or rear wall of the load-lock chamber 50 is discharged through the intake openings 92 at the upper end of the ductwork 90. Thus, this purge gas does not flow along the walls of the load-lock chamber and hence, does not produce particles which could contaminate the wafers. Similarly, the purge gas flowing toward the wide space between the front of the wafer cassette 12 and the inner surface of the front wall of the load-lock chamber 50 does not flow along the inner surface of the front wall of the load-lock chamber 50. Rather, this purge gas through the cassette 12, out the back of the cassette 12, and then is discharged through the intake openings 92 of the ductwork 90. Thus, this purge gas also does not produce particles in the load-lock chamber 50.

After the load-lock chamber 50 is purged, the wafer cassette 12 is raised by the elevator 76 to place the uppermost wafer 10 in the cassette 12 level with the slit valve 52 (according to a wafer detecting sensor previously described in connection with the first embodiment and not shown). Then, the slit valve 52 is opened so that the robot arm 42 can remove the wafer 10 from the cassette 12. At this time, the degree of vacuum in the load-lock chamber 50 may be higher than that in the transfer chamber 40. Thus, gas in the transfer chamber 40 is introduced into the load-lock chamber 50 through the slit valve 52. In this case, the gas flows through the wafer cassette 12 to the intake openings 92 of the ductwork 90 formed directly across from the slit valve 52 at the rear of the load-lock chamber 50. That is, most of the gas is discharged along the shortest straight line path. Any gas which flows between the top, sides, or bottom of the wafer cassette 12 and an inner wall surface of the load-lock chamber 50 is discharged directly through the intake openings 92 of the ducts disposed on opposite sides of the door 54. As such, the ductwork 90 minimizes the dislodging of contaminants from the inner surfaces of the walls of the load-lock chamber 50 and prevents any particles that are produced from contaminating the wafers 10.

On the other hand, when the degree of vacuum in the load-lock chamber 50 is lower than that in the transfer chamber 40, the air in the load-lock chamber 50 is introduced into the transfer chamber 40 through the slit valve 50. At this time, the pressure in the upper portion of the load-lock chamber 50 provided with the slit valve 52 is less than that in the lower portion of the load-lock chamber 50. This pressure difference in the load-lock chamber 50 can produce a current or eddy. However, the pump 60 is operated so that some of the air in load-lock chamber 50 is discharged through the intake openings 92 of the ductwork 90 including those at the lower portion of the load-lock chamber 50. Accordingly, only a relatively weak current or eddy is produced in the load-lock chamber 50. Therefore, the ductwork 90 prevents particles from being produced when the slit valve 52 is opened in a state in which the degree of vacuum in the load-lock chamber 50 is lower than that in the transfer chamber 40.

In any case, the slit valve 52 is closed once the wafer 10 is transferred into the transfer chamber 40 by the robot arm 42. Then, the robot arm 42 loads the wafer 10 into the alignment apparatus 30, and the wafer 10 is oriented so that the flat zone of the wafer 10 faces in a given direction. Next, the robot arm 42 loads the wafer 10 into a process chamber 20, and then the wafer 10 is processed in the process chamber 20. As was previously described, once the wafer is loaded into the process chamber 20, the robot arm 42 takes another wafer 10 out of the load-lock chamber 50, loads the wafer 10 into the alignment apparatus 30 so that the wafer 10 is oriented, and then loads the wafer 10 into another process chamber 20. This operation is repeated for all of the wafers 10 in the wafer cassette 12.

Once a wafer 10 has been processed, the robot arm 42 removes the processed wafer 10 out of a process chamber 20, and loads the wafer 10 into a wafer cassette 12 in a load-lock chamber 50. At this time, the slit valve 52 is opened. As mentioned above, a current or eddy may be generated when the slit valve 52 is opened, due to a pressure difference between the load-lock chamber 50 and the transfer chamber 40. However, evacuation of gas through the ductwork 90 at this time moderates the intensity of the current or eddy, as well as discharges any particles produced thereby so that such particles do not contaminate the wafers 10.

Subsequently, the blade 44 of the robot arm 42 is retracted into the transfer chamber 40, and the wafer cassette 12 is raised. Thus, the next wafer 10 on which the semiconductor manufacturing process will be performed is positioned level with the slit valve 52. Next, the blade 44 of the robot arm 42 removes the wafer 10 from the wafer cassette 12, and transfers the wafer 10 through the slit valve 52 from the load-lock chamber 50 to the transfer chamber 40. Then, the slit valve 52 is closed. The above-described operations are repeated until all of the wafers 10 in a wafer cassette 12, typically 25 wafers, have been processed and returned to a wafer cassette.

Thus, a strong acid solution or absorbed substance evaporates from the surface of the processed wafers 10 that have already been loaded into a wafer cassette in a load-lock chamber 50. However, the ductwork 90 allows the resulting fumes to be quickly discharged straight back from the wafer cassette 12 and out of the load-lock chamber 50 without producing a strong current or eddy along an inner wall surface of the load-lock chamber.

Furthermore, once all of the wafers have been processed and loaded into a wafer cassette 12, the door 54 of the load-lock chamber 50 is opened so that the wafer cassette 12 can be removed in preparation for the processing of another batch of wafers. However, purge gas is supplied into the load-lock chamber 50 through the purge gas supply line 56 before the door 54 is opened to bring the pressure in the load-lock chamber 50 to atmospheric pressure. Thus, a current of eddy of the purge gas is produced in the load-lock chamber 50 is proportionally increased. The current or eddy can remove contaminants from the door 54 and inner surfaces of the walls of the load-lock chamber and entrain the resulting particles. However, once again, the ductwork 90 is used to discharge the purge gas and particles at the inner surface of the door 54 and/or inner surface of the rear wall of the load-lock chamber 50. Thus, the ductwork 90 prevents local contamination of the wafers 10 near the flat zones of the wafers 10 that are exposed at the back of the wafer cassette 12.

Finally, although the present invention has been described above in connection with the preferred embodiments thereof, such a description is merely illustrative of the present invention. For example, although separate embodiments having the anti-eddy cover 80 and the ductwork 90, respectively, have been disclosed, semiconductor device manufacturing equipment according to the present invention may be provided with both an anti-eddy cover 80 and the ductwork 90. Thus, modifications of and changes to the preferred embodiments, as will be apparent to those of ordinary skill in the art, are seen to be within the true spirit and scope of the present invention as defined by the appended claims.

What is claimed is:

1. Semiconductor device manufacturing equipment comprising:
   at least one process chamber in which a semiconductor device manufacturing process is performed;
   a transfer chamber to which each said at least one process chamber is connected, and a robot arm disposed in the transfer chamber;
   a wafer cassette having an open front, an open back, and configured to support a plurality of wafers as spaced apart from each other and each extending across the cassette from front to back, whereby wafers supported in the cassette will be exposed at the open back of the cassette;
   a load-lock having a load-lock chamber including a front wall and a back wall and defining an opening in the back wall of the load-lock chamber and sized to permit the wafer cassette to pass therethrough, and an exhaust port through which the load-lock chamber is evacuated,
   a slit valve disposed at the front wall of the load-lock chamber, the slit valve being openable and closable to selectively place the interior of the load-lock chamber in communication with the interior of the transfer chamber through the front wall,
   a door disposed over the opening in the back wall of the load-lock chamber, the door being mounted to the chamber so as to be openable and closable to uncover and cover the opening, respectively, whereby the wafer cassette can be inserted into the chamber through the back thereof when the door is opened, and
   a wafer cassette holder disposed in the load-lock chamber and configured to support the wafer cassette upright in the load-lock chamber with the open back of the cassette facing the door of the load-lock between the front and rear walls of the load-lock chamber;
   an exhaust system connected to the exhaust port of the load-lock chamber; and
   wafer anti-contamination means for preventing wafers from being contaminated while in a wafer cassette supported by the wafer cassette holder in the chamber of the load-lock.

2. Semiconductor device manufacturing equipment comprising:
   at least one process chamber in which a semiconductor device manufacturing process is performed;
   a transfer chamber to which each said at least one process chamber is connected, and a robot arm disposed in the transfer chamber;
   a wafer cassette having an open front, an open back, and configured to support a plurality of wafers as spaced apart from each other and each extending across the cassette from front to back, whereby wafers supported in the cassette will be exposed at the open back of the cassette;
   a load-lock having a load-lock chamber including a front wall and a back wall and defining an opening in the back wall of the load-lock chamber and sized to permit the wafer cassette to pass therethrough, and an exhaust port through which the load-lock chamber is evacuated,
   a slit valve disposed at the front wall of the load-lock chamber, the slit valve being openable and closable to selectively place the interior of the load-lock chamber in communication with the interior of the transfer chamber through the front wall,
   a door disposed over the opening in the back wall of the load-lock chamber, the door being mounted to the chamber so as to be openable and closable to uncover and cover the opening, respectively, whereby the wafer cassette can be inserted into the chamber through the back thereof when the door is opened, and
   a wafer cassette holder disposed in the chamber and configured to support the wafer cassette upright in the load-lock chamber with the open back facing the door of the load-lock between the front and rear walls of the load-lock chamber;
   an exhaust system connected to the exhaust port of the load-lock chamber; and
   an anti-eddy cover covering the open back of the wafer cassette when the wafer cassette is supported by the cassette holder in the load-lock chamber.

3. The equipment according to claim 2, wherein the anti-eddy cover is of a plastic corrosion-resistant material.

4. The equipment according to claim 2, wherein the anti-eddy cover is transparent.

5. The equipment according to claim 2, wherein the cassette holder includes a plurality of spaced apart support plates configured to support the back of the wafer cassette, and a plurality of guide plates which will surround side surfaces and upper and lower ends of the back of the wafer cassette when the wafer cassette is supported by the cassette holder, the anti-eddy cover spanning the support plates.

* * * * *